(12) United States Patent
Lee et al.

(10) Patent No.: US 11,953,553 B2
(45) Date of Patent: Apr. 9, 2024

(54) CONTACT POINT MONITORING DEVICE FOR VACUUM CIRCUIT BREAKER, AND CORRECTION METHOD PERFORMED THROUGH SAME

(71) Applicant: LS ELECTRIC CO., LTD., Anyang-si (KR)

(72) Inventors: Hyun-Wook Lee, Anyang-si (KR); Ju-Hyun Kim, Anyang-si (KR)

(73) Assignee: LS ELECTRIC CO., LTD., Anyang-si (KR)

( * ) Notice: Subject to any disclaimer, the term of this patent is extended or adjusted under 35 U.S.C. 154(b) by 338 days.

(21) Appl. No.: 17/601,535

(22) PCT Filed: Mar. 13, 2020

(86) PCT No.: PCT/KR2020/003554
§ 371 (c)(1),
(2) Date: Oct. 5, 2021

(87) PCT Pub. No.: WO2020/204397
PCT Pub. Date: Oct. 8, 2020

(65) Prior Publication Data
US 2022/0206070 A1 Jun. 30, 2022

(30) Foreign Application Priority Data

Apr. 5, 2019 (KR) .................. 10-2019-0040207
Apr. 5, 2019 (KR) .................. 10-2019-0040220

(51) Int. Cl.
*G01R 31/327* (2006.01)
*G01N 21/55* (2014.01)
*H01H 33/664* (2006.01)

(52) U.S. Cl.
CPC ......... *G01R 31/3275* (2013.01); *G01N 21/55* (2013.01); *H01H 33/664* (2013.01)

(58) Field of Classification Search
CPC .............. G01R 23/02; G01R 19/2513; G01R 31/3274; G01R 19/2506; G01R 31/3275;
(Continued)

(56) References Cited

U.S. PATENT DOCUMENTS

| 7,049,532 B2 | 5/2006 | Kanazawa et al. |
| 7,098,418 B1 | 8/2006 | Yamada et al. |

(Continued)

FOREIGN PATENT DOCUMENTS

| JP | 06-215669 | * 1/1993 | ............. H01H 33/59 |
| JP | H06215669 A | 8/1994 | |

(Continued)

OTHER PUBLICATIONS

International Search Report for related International Application No. PCT/KR2020/003554; report dated Oct. 8, 2020; (5 pages).

(Continued)

*Primary Examiner* — Alexander Satanovsky
*Assistant Examiner* — Trung Q Nguyen
(74) *Attorney, Agent, or Firm* — K&L Gates LLP

(57) ABSTRACT

The present disclosure relates to a contact point monitoring device for a vacuum circuit breaker, and a correction method performed through same, wherein deviations due to temperature in a sensor for monitoring the amount of wear at a contact point may be compensated for. According to the present disclosure, the amount of wear at the contact point may be accurately detected by correcting a characteristic value of a photosensor according to operation temperature, by taking into consideration the temperature characteristics of the photosensor.

14 Claims, 11 Drawing Sheets

(58) Field of Classification Search
CPC ............... H01H 33/664; H01H 1/0015; H01H 33/666; G01N 21/55
USPC ........ 324/415–435, 600, 677–681, 709–713, 324/76.11, 76.41, 76.79–76.83
See application file for complete search history.

(56) References Cited

U.S. PATENT DOCUMENTS

| | | | |
|---|---|---|---|
| 7,952,065 B2 | 5/2011 | Hama | |
| 2018/0254159 A1* | 9/2018 | Shi | ........................ H01H 33/666 |

FOREIGN PATENT DOCUMENTS

| | | | |
|---|---|---|---|
| JP | 2005071727 A | 3/2005 | |
| JP | 2006310133 A | 11/2006 | |
| JP | 2007202298 A | 8/2007 | |
| JP | 2876233 B2 | 12/2011 | |
| KR | 101860348 B1 | 5/2018 | |

OTHER PUBLICATIONS

Written Opinion for related International Application No. PCT/KR2020/003554; report dated Oct. 8, 2020; (5 pages).

* cited by examiner

CONTACT POINT MONITORING DEVICE FOR VACUUM CIRCUIT BREAKER, AND CORRECTION METHOD PERFORMED THROUGH SAME

CROSS-REFERENCE TO RELATED APPLICATIONS

This application is the National Stage filing under 35 U.S.C. 371 of International Application No. PCT/KR2020/003554, filed on Mar. 13, 2020, which claims the benefit of earlier filing date and right of priority to Korea utility model Application No. 10-2019-0040207 filed on Apr. 5, 2019, and Korea utility model Application No. 10-2019-0040220, filed on Apr. 5, 2019, the contents of which are all hereby incorporated by reference herein in their entirety.

FIELD

The present disclosure relates to a contact monitoring device for a vacuum circuit breaker capable of compensating for a deviation depending on a temperature of a sensor for contact wear amount monitoring and a correction method thereof.

BACKGROUND

A vacuum circuit breaker is an electrical protector that uses dielectric strength of the vacuum to protect load devices and lines from fault currents in an event of short circuits or ground faults occurring in electrical circuits.

The vacuum circuit breaker performs power transport control and power system protection. The vacuum circuit breaker has a large breaking capacity and high reliability and safety. Because the vacuum circuit breaker may be mounted in a small installation space, the breaker may be easily applied to a voltage range from a medium voltage to high voltage.

The vacuum circuit breaker includes a vacuum interrupter that blocks current, a power transmission device that transmits power to the vacuum interrupter, and a push rod that performing vertical reciprocating motion under power from the power transmission device to insert or withdraw a contact in the vacuum interrupter. In an example, Korean patent No. 10-1860348 (issue date May 16, 2018) discloses a vacuum interrupter of a vacuum circuit breaker (Hereinafter, reference numerals cited in descriptions of the conventional vacuum interrupter are those applied only to the description of the conventional vacuum interrupter).

The conventional vacuum interrupter 100 disclosed in the above-mentioned prior literature includes an insulating container 190, a fixed electrode 110, a movable electrode 150, and an arcing shield 210. The fixed electrode 110 and the movable electrode 150 have a fixed contact 130 and a movable contact 170, respectively. According to vertical movement of the movable electrode 150, the movable contact 170 contacts or is removed from the fixed contact 130.

The fixed contact 130 and the movable contact 170 have wear as a current blocking operation is repeated. When a contact wear amount is above a certain amount, repair or replacement is necessary. When the repair or replacement of the contact is not carried out in an appropriate time, short-time performance, short-circuit performance, and conductance performance of the vacuum interrupter may deteriorate. Therefore, it is necessary to detect a correct wear state of the contact.

Further, even when a sensor is used to detect the wear state of the contact, characteristics of the sensor may vary depending on an operation temperature thereof. Thus, a correction method that may accurately correct the variation and derive a reliable detection result is also needed.

SUMMARY

A purpose of the present disclosure is to provide a contact monitoring device for a vacuum circuit breaker capable of compensating for a deviation depending on a temperature of a sensor for contact wear amount monitoring and a correction method thereof.

Purposes of the present disclosure are not limited to the above-mentioned purpose. Other purposes and advantages of the present disclosure that are not mentioned above may be understood based on following descriptions, and will be more clearly understood with reference to embodiments of the present disclosure. Further, it will be readily apparent that the purposes and advantages of the present disclosure may be realized using means and combinations thereof indicated in the Claims.

The present disclosure provides a contact monitoring device for a vacuum circuit breaker, wherein the vacuum circuit breaker includes a push rod assembly coupled to a movable electrode of a vacuum interrupter to raise or lower the movable electrode, wherein the contact monitoring device comprises: a discriminative sticker attached to an outer circumferential surface of the push rod assembly, extending along a moving direction of the push rod assembly, and composed of a plurality of areas whose reflectance vary step by step; a photosensor module including: a light-emitter facing toward the discriminative sticker and emitting light toward the discriminative sticker; a light-receiver facing toward the discriminative sticker and receiving light reflected from the discriminative sticker; and a circuit coupled to the light-emitter and the light-receiver, wherein the circuit processes a signal from the light-receiver and obtains an amount of current according to intensity of the reflected light, based on the processing result; and a data processing device communicating with the photosensor module, wherein the data processing device is configured to determine a movement amount of the push rod assembly based on the amount of the current obtained by the photosensor module and to calculate a contact wear amount based on the movement amount.

The plurality of areas of the discriminative sticker are arranged in a gradation manner.

The device further comprises a temperature sensor installed adjacent to the photosensor module to measure a temperature around the photosensor module, wherein the data processing device is configured to: communicate with the temperature sensor; determine the movement amount of the push rod assembly based on the amount of the current obtained by the photosensor module; calculate the contact wear amount based on the movement amount; and correct a contact wear amount determination reference based on a measurement result of the temperature sensor.

Further, the present disclosure provides a correction method of a contact monitoring device for a vacuum circuit breaker, wherein the device monitors a contact state using a voltage output value output from a photosensor module, wherein the method comprises: a step S200 of determining whether the contact state of the vacuum circuit breaker has changed; when the contact state of the vacuum circuit breaker has changed in the S200 step, a step S300 of determining whether the vacuum circuit breaker has changed to a contact inserted state; when the vacuum circuit breaker has changed to the contact inserted state in the S300 step, a step S400 of determining a position of a push rod assembly of the vacuum circuit breaker based on a voltage output value output from the photosensor module; when the position of the push rod assembly is determined in the S400 step, a step S500 of determining, based on a contact wear amount determination reference, whether the contact state is normal in the contact insertion, and whether a contact wear amount is smaller than or equal to a set value; and a step S600 of storing the determination result of the S500 step.

The method further comprises: when the contact state of the vacuum circuit breaker is not changed in the S200 step, a step S210 of determining whether a current time has reached the preset period; when the current time has reached the preset period in the S210 step, a step S310 of determining whether the vacuum circuit breaker is in a contact open state; when the vacuum circuit breaker is in the contact open state in the S310 step, a step 330 of measuring an open position of the push rod assembly of the vacuum circuit breaker based on the voltage output value output from the photosensor module; when the vacuum circuit breaker is not in the contact open state in the S310 step, a step S350 of measuring a closed position of the push rod assembly of the vacuum circuit breaker based on the voltage output value output from the photosensor module; and a step S370 of determining whether the contact wear amount determination reference correction of the photosensor module is required based on the open or closed position of the push rod assembly measured in the S330 or the S350 step, and correcting the contact wear amount determination reference.

The position of the push rod assembly, the open position and the closed position of the push rod assembly respectively in the S330, the S350 and the S400 step is measured by emitting light the photosensor module to a discriminative sticker attached to an outer circumferential surface of a rod housing of the push rod assembly, and measuring a current value of light reflected from the discriminative sticker and received by the photosensor module or a voltage output value converted from the current value.

The discriminative sticker extends along a moving direction of the push rod assembly, and is composed of a plurality of areas whose reflectance vary step by step.

The plurality of areas of the discriminative sticker are arranged in a gradation manner.

The photosensor module includes: a light-emitter facing toward the discriminative sticker and emitting light toward the discriminative sticker; a light-receiver facing toward the discriminative sticker and receiving light reflected from the discriminative sticker; and a circuit coupled to the light-emitter and the light-receiver, wherein the circuit processes a signal from the light-receiver and obtains an amount of current according to intensity of the reflected light, based on the processing result.

The S600 step is performed after the S370 step.

The S370 step includes, when the voltage output value output from the photosensor module has changed while the contact state of the vacuum circuit breaker has not changed, determining that an external temperature has charged, and changing the contact wear amount determination reference.

The change in the voltage output value output from the photosensor module in the step S370 is determined by comparing the voltage output value output from the photosensor module measured in the preset period with the voltage output value output from the photosensor module measured before the preset period.

The method further comprises: when the contact state of the vacuum circuit breaker has not changed in the S200 step, a step S210 of determining whether a current time has reached the preset period; when the current time has reached the preset period in the S210 step, a step S230 of determining whether the temperature has changed based on a measured value of the temperature sensor; and upon determination that the temperature has changed in the S230 step, a step S250 of changing the contact wear amount determination reference.

The S600 step is performed after the S250 step.

Upon determination that the temperature has increased or decreased in the S250 step, a current contact wear amount determination reference is changed to a contact wear amount determination reference corrected based on the increased or decreased temperature.

The S230 step includes monitoring the measured value of the temperature sensor in real time or periodically.

The contact monitoring device for the vacuum circuit breaker according to the present disclosure and a correction method thereof the same may correct the characteristic value of the photosensor based on the operation temperature in consideration of the temperature characteristic of the photosensor, thereby detecting an accurate contact wear amount.

In addition, the contact monitoring device for the vacuum circuit breaker and the correction method thereof according to the present disclosure may correct the characteristic value of the photosensor using the temperature sensor, thereby accurately detecting the contact wear amount even when the detection result of the photosensor varies depending on the operation temperature.

The above-described effects, and specific effects of the present disclosure as not mentioned above will be described based on specific details for carrying out the disclosure.

DETAILED DESCRIPTION

Figure 1:
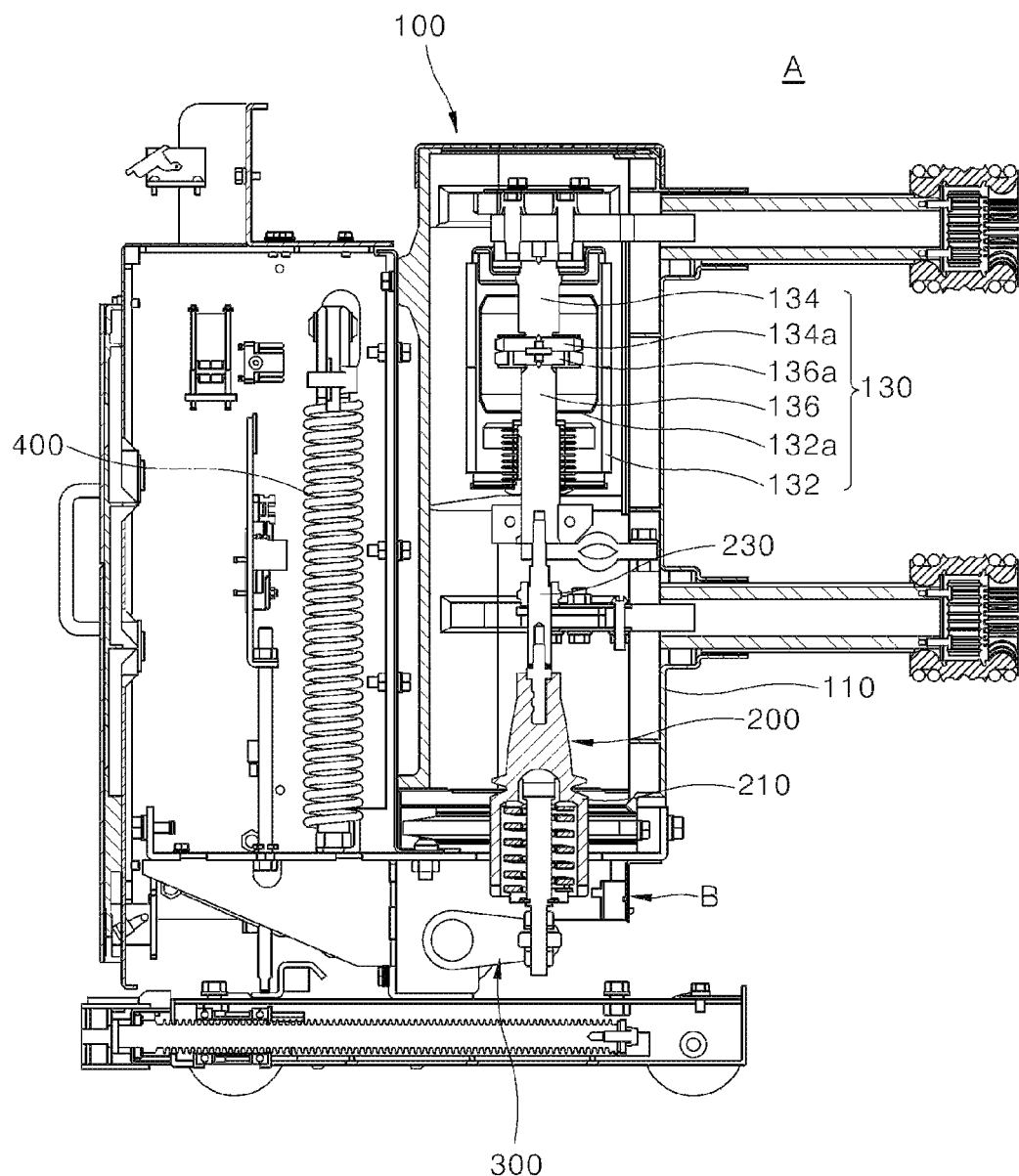
FIG. 1 is a partial cross-sectional view showing a vacuum circuit breaker to which a contact monitoring device according to a first or second embodiment of the present disclosure is applied.

The above objects, features and advantages will be described in detail later with reference to the accompanying drawings. Accordingly, a person with ordinary knowledge in the technical field to which the present disclosure belongs will be able to easily implement the technical idea of the present disclosure. In describing the present disclosure, when it is determined that a detailed description of a identified component related to the present disclosure may unnecessarily obscure gist the present disclosure, the detailed description is omitted. Hereinafter, a preferred embodiment according to the present disclosure will be described in detail with reference to the accompanying drawings. In the drawings, the same reference numerals are used to indicate the same or similar elements.

In addition, it will also be understood that when a first element or layer is referred to as being present "on" or "beneath" a second element or layer, the first element may be disposed directly on or beneath the second element or may be disposed indirectly on or beneath the second element with a third element or layer being disposed between the first and second elements or layers.

It will be understood that when an element or layer is referred to as being "connected to", or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

FIG. 1 is a partial cross-sectional view showing a vacuum circuit breaker to which a contact monitoring device according to a first or second embodiment of the present disclosure is applied.

As shown in FIG. 1, a contact monitoring device B for a vacuum circuit breaker according to the first or second embodiment of the present disclosure is installed below a main circuit 100 of a vacuum circuit breaker A to monitor a contact wear of the vacuum interrupter 130. The contact monitoring device B communicates with a data processing device 800 installed outside the vacuum circuit breaker in a wired or wireless manner.

First, main components of the vacuum circuit breaker A are briefly described. Hereinafter, only some components of the vacuum circuit breaker related to an embodiment of the present disclosure will be briefly described.

The vacuum circuit breaker A includes a main circuit 100 including a vacuum interrupter 130, a push rod assembly 200 and a main shaft 300 for transmitting power to a contact of the vacuum interrupter 130, and a mechanism assembly 400 that generates a driving force and is connected to the main shaft 300 to deliver the driving force thereto.

The main circuit 100 has a housing 110 and the vacuum interrupter 130 installed inside the housing 110. The vacuum interrupter 130 includes an insulating container 132 having a receiving space defined therein, a fixed electrode 134 fixedly received in a upper portion of the insulating container 132, and a fixed contact 134a disposed at an end of the fixed electrode 134, a movable electrode 136 installed in a lower portion of the insulating container 132 to be movable up and down, and a movable contact 136a disposed at an end of the movable electrode 136. A arc shield 132a that creates vacuum is housed inside the insulating container 132. The arc shield 132a wraps around the fixed electrode 134 and the fixed contact 134a, and the movable electrode 136 and the movable contact 136a. The movable contact 136a may be brought into in an inserted state in which the movable contact 136a comes into contact with the fixed contact 134a under movement of the movable electrode 136 or may be brought into a withdrawn state (blocked state) in which the movable contact 136a is spaced from the fixed contact 134a. The movable electrode 136 ascends or descends under movement of the push rod assembly 200.

The push rod assembly 200 inserts or withdraws the movable electrode 136. The push rod assembly 200 includes a movable rod 210 connected to the movable electrode 136 and a push rod 230 connected to the main shaft 300, and a rod housing 250 having a top coupled to the movable rod 210 and a bottom coupled to the push rod 230, and an inserting spring 270 which is accommodated inside the rod housing 250 and is compressed or restored by the push rod 230. The main shaft 300 is connected to the bottom of the push rod 230.

The main shaft 300 is connected to the mechanism assembly 400 and transmits the power generated from the mechanism assembly 400 to the push rod assembly 200.

Figure 2:
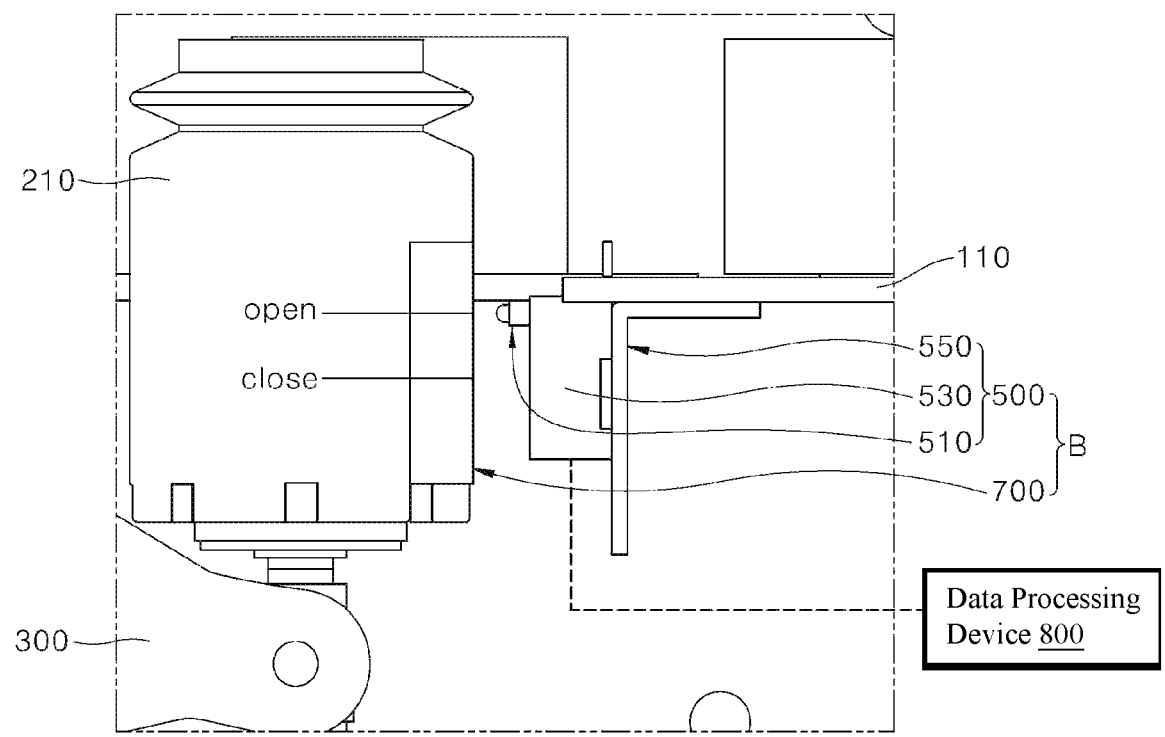
FIG. 2 is a perspective view showing an installed state of the contact monitoring device according to the first embodiment of the present disclosure.
Figure 3:
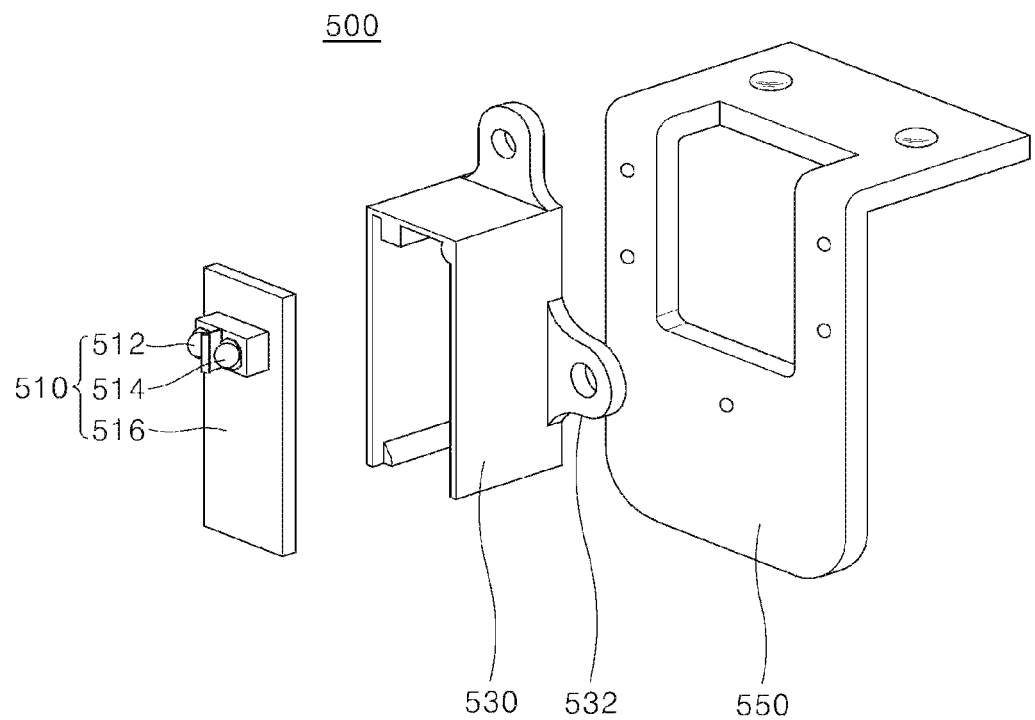
FIG. 3 is an exploded perspective view showing a photosensor of the contact monitoring device according to the first embodiment of the present disclosure.
Figure 4:
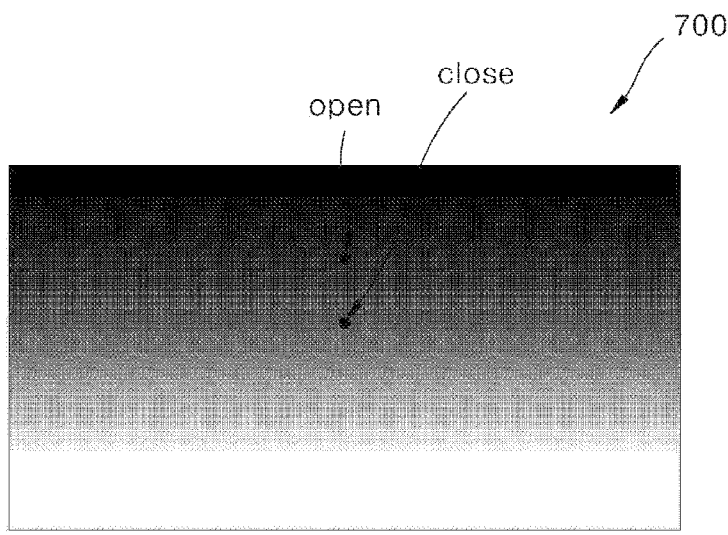
FIG. 4 is a schematic diagram showing a discriminative sticker of the contact monitoring device according to the first embodiment of the present disclosure.
Figure 5:
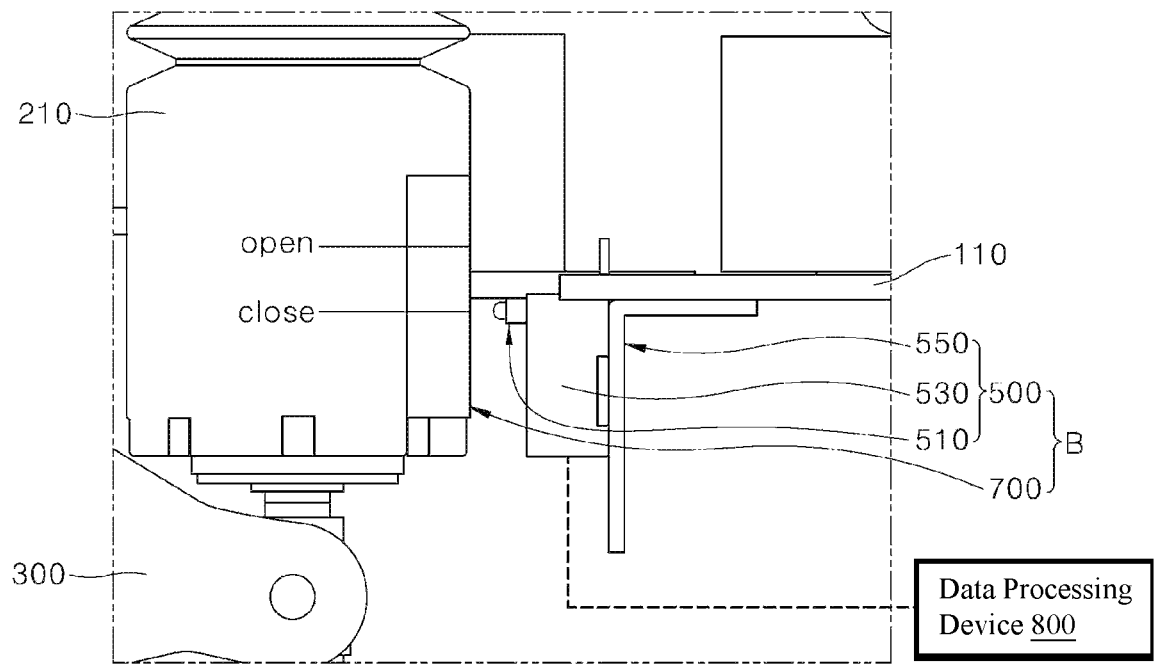
FIG. 5 is a perspective view showing an operating state of the contact monitoring device according to the first embodiment of the present disclosure.

FIG. 2 is a perspective view showing an installed state of the contact monitoring device according to the first embodiment of the present disclosure. FIG. 3 is an exploded perspective view showing a photosensor of the contact monitoring device according to the first embodiment of the present disclosure. FIG. 4 is a schematic diagram showing a discriminative sticker of the contact monitoring device according to the first embodiment of the present disclosure. FIG. 5 is a perspective view showing an operating state of the contact monitoring device according to the first embodiment of the present disclosure.

As shown in FIG. 2 and FIG. 3, the contact monitoring device B according to the first embodiment of the present disclosure includes a sensor assembly 500 installed on a bottom face of the main circuit 100, a discriminative sticker 700 attached to an outer circumferential face of a rod housing 210, and a data processing device 800 for overall control and determination.

The sensor assembly 500 includes a photosensor module 510 for detecting a position of the discriminative sticker 700, a sensor holder 530 for accommodating therein the photosensor module 510, and a sensor bracket 550 for coupling the sensor holder 530 to the bottom of the main circuit 100.

The photosensor module 510 includes a light-emitter 512 and light-receiver 514, and a circuit 516 that processes signals from the light-emitter 512 and the light-receiver 514. The light-emitter 512 and the light-receiver 514 are mounted side by side and on one face of the circuit 516. The photosensor module 510 is mounted such that the light-emitter 512 and the light-receiver 514 face toward the housing 110 of the push rod assembly 200. Meaning of the orientation in which the photosensor module 510 is mounted will be described later.

The light-emitter 512 of the photosensor module 510 may emit light. The light-receiver 514 thereof detects an amount of the light reflected from a surface of discriminative sticker 700.

A photocurrent proportional to an intensity of the light detected by the light-receiver 514 flows in the circuit 516. Thus, the larger the amount of reflected and returned light, the larger the amount of the current generated. The circuit 516 converts the photocurrent value into a voltage value and transmits the voltage value to the data processing device 800. However, the photocurrent value may be directly transferred to the data processing device 800 according to setting or need and may be used as a reference for determination. The photosensor module 510 detects the amount of the light emitting from the light-emitter 512 and then reflected from the sticker. Thus, as an object is farther away from the photosensor module 510, an amount of light reflected from the object and then incident to the light-receiver 514 decreases. As the amount of the incident light decreases, the photocurrent becomes weaker. Thus, a distance between the object and the photosensor module 510 is identified.

Therefore, a direction in which the photosensor module 510 emits light and then the light is reflected from the sticker and is incident to the module 510 refers to a sensing direction thereof. The photosensor module 510 may detect a displacement in the same direction as the sensing direction.

The circuit 516 may process the photocurrent to generate a signal and may output the signal to an external component. An intensity of the output signal decreases or increases based on the sensed light amount. The light amount varies based on the displacement. Therefore, processing the signal output from the circuit 516 may allow the displacement to be calculated. The signal output from the circuit 516 may be transmitted to the data processing device 800 to be later described, or to a smart terminal of an administrator not shown in the drawing or the like.

The sensor holder 530 houses the photosensor module 510. The sensor holder 530 may have a box shape with one open side face. The light-emitter 512 and the light-receiver 514 of the photosensor module 510 are exposed through one open side face of the sensor holder 530. The sensor holder 530 may have coupling means 532 in a side face opposite to the open one side face. The coupling means may be coupled to the sensor bracket 550. The coupling means 532 may be embodied as a hole into which a bolt is inserted.

The sensor holder 530 may have a frame shape such as a 'L', inversed 'L', or '⊏' shape rather than the box shape as long as the photosensor module 510 is inserted into but is not separated from the holder.

The sensor bracket 550 is mounted on a bottom of the housing 110 defining an exterior appearance of the main circuit 100. The sensor bracket 550 is not limited in a shape thereof as long as the sensor bracket may support the sensor holder 530. However, in accordance with the present disclosure, the photosensor module 510 should face toward the rod housing 210. Accordingly, the sensor bracket 550 has an inverted 'L' shape. The sensor holder 530 is coupled to a bottom face of the housing 110 of the main circuit 100. A plurality of fastening holes for fastening the sensor holder 530 to the sensor bracket 550 and a plurality of fastening holes for fastening the sensor bracket 550 to the housing 110 may be defined in a plate plane of the sensor bracket 550. The sensor bracket 550 may be coupled to the sensor holder 530 and the housing 110 via bolting or the like.

In the above-described embodiment, a case in which the sensor holder 530 and the sensor bracket 550 are separate components is described by way of example. However, when the sensor holder 530 and the sensor bracket 550 accommodate therein the photosensor module 510 and are coupled to the housing 110 of the main circuit 100, the sensor holder 530 and the sensor bracket 550 may be integrated into a single component. The photosensor module 510 mounted in the above manner may measure a displacement in a direction different from the sensing direction using the discriminative sticker 700.

As shown in FIG. 4, the discriminative sticker 700 refers to a sticker attached to the outer circumferential face of the rod housing 210. The discriminative sticker 700 has a rectangular shape with a predefined size. The discriminative sticker 700 is attached thereto such that the discriminative sticker 700 faces toward the photosensor module 510. As shown in FIG. 4, a partial area as an upper end of the discriminative sticker 700 is white, a partial area as a lower end thereof is black, and an area between the white area and the black area is a gray area in which a gray level is gradually increased or decreased. Otherwise, a partial area as a lower end of the discriminative sticker 700 is white, a partial area as an upper end thereof is black, and an area between the white area and the black area is a gray area in which a gray level is gradually increased or decreased. That is, the reflectance of one area of the discriminative sticker 700 is different from the reflectance of another area thereof. Thus, the photosensor module 510 may identify the difference and distinguish the two areas from each other.

The discriminative sticker 700 may have a plurality of areas in which the color or gray level changes from white to gray to black, or from black to gray to white in a stepwise manner. The areas with different colors or contrasts of the discriminative sticker 700 have different reflectance.

The white and black areas of the discriminative sticker 700 may be arranged in a vertical direction. Each of the bottommost white area and the topmost black area of the discriminative sticker 700 acts as an area bordering a surrounding area to prevent a color of the surrounding area from affecting the sensing result. The bottommost white area and the topmost black area of the discriminative sticker 700 may occupy 10% of a total area of the discriminative sticker 700, and a remaining area thereof may be a gradation area. Alternatively, an entire area of the discriminative sticker 700 including a bottommost area and a topmost area may be a gradation area (in this case, an initial sensed position or an attachment position may be adjusted so that the detection may be performed while the detection is not affected by a surrounding color). The attachment position of the discriminative sticker 700 may be adjusted so that a detection area of the photosensor module 510 is present within the gradation area except for the black and white areas of the discriminative sticker 700.

When the discriminative sticker 700 has the gradation, a current value of the reflected light from the gradation area gradually changes as a gray level of the gradation area gradually varies.

The discriminative sticker 700 is used to discriminate the contact wear amount corresponding to a displacement perpendicular to the sensing direction of the photosensor module 510.

That is, the discriminative sticker 700 acts as a sticker for discriminating whether a vertical level to which the push rod assembly 200 moves upwardly changes because the fixed contact 134a and/or the movable contact 136a are worn by an amount equal to or greater than a certain amount (herein, the contact wear amount may be defined as a vertical displacement by which the push rod assembly ascends because the fixed contact or the movable contact is worn due to the repeated inserted states. Because it is difficult to directly measure an upward displacement of the push rod, the displacement of the push rod is indirectly measured using the discriminative sticker attached to the rod housing).

The discriminative sticker 700 is positioned such that an open position of FIG. 2 reflects the light emitting from the photosensor module 510 in a contact withdrawn state when the movable contact is not inserted. Further, in the movable contact inserted state, the light emitting from the photosensor module 510 may be reflected from a closed position (refer to FIG. 5) of the discriminative sticker 700. An area of the discriminative sticker 700 that reflects the light emitting from the photosensor module 510 is set to an open position in FIG. 4, the contact insert position, and an area adjacent to the insert position.

In one example, the current values corresponding to the open and closed positions of the discriminative sticker 700 measured by the photosensor module 510 are transmitted to the data processing device 800. As shown in FIG. 2 and FIG. 5, the data processing device 800 is installed outside the vacuum circuit breaker A and communicates with the photosensor module 510. The data processing device 800 identifies a position of the push rod assembly 200 based on data measured by the photosensor module 510. Further, the data processing device 800 determines the contact wear amount based on the position of the push rod assembly 200 and determines whether to notify the amount to the user. The data processing device 800 sets a reference required for determining the contact wear amount and corrects the reference based on the temperature. Detailed functions of the data processing device 800 will be described later.

A method for detecting the contact wear amount using the photosensor module in the contact monitoring device according to the first embodiment of the present disclosure having the above-described configuration will be described in detail as follows.

Because the push rod assembly 200 moves in the vertical direction in FIG. 2, the push rod assembly 200 is always maintained at the same position in the contact withdrawn (open) state or the contact withdrawn state (open position). In the initial inserted state, the push rod assembly 200 has a certain amount of a vertical displacement (closed position). After the initial insertion of the movable contact, the contact inserted (closed) state is maintained until a fault current occurs or the movable contact is withdrawn for inspection. Therefore, contact wear does not occur.

However, when the contact wear occurs as the movable contact is inserted multiple times after the withdrawal state, the push rod assembly 200 ascends in the vertical direction by a displacement corresponding to the wear amount. That is, an increase in the vertical displacement of the push rod assembly 200 corresponds to the contact wear amount.

In order to measure the displacement amount of the push rod assembly 200, the vertical displacement of the push rod assembly 200 must be detected. To this end, it is preferable to install a sensor capable of detecting the vertical displacement below the push rod assembly 200. However, because the main shaft 300 is coupled to a lower end of the push rod assembly 200 and lower components of the vacuum circuit breaker A exist below the push rod assembly 200, it is difficult to secure a sufficient space to install the sensor below the push rod assembly 200.

Therefore, the photosensor module 510 according to the present disclosure is installed adjacent to the outer circumferential face of the rod housing 210 and installed at one side parallel to the vertical movement direction of the push rod assembly 200. In this connection, the sensing direction of the photosensor module 510 is perpendicular to the vertical movement direction of the push rod assembly 200. Further, in order to minimize an interference with surrounding portions, the photosensor module 510 is installed on the bottom of the housing 110 of the main circuit 100 and adjacent to the outer circumferential face of the rod housing 210.

The push rod assembly 200 only has the displacement in the vertical direction and does not move in a horizontal direction. Thus, even when the photosensor module 510 is installed on one side face of the push rod assembly 200, the vertical displacement of the push rod assembly 200 is not detected by the photosensor module 510. To solve this problem, in this embodiment, the discriminative sticker 700 is applied to generate the same effect as converting the vertical displacement of the push rod assembly 200 into the horizontal displacement thereof. The photosensor module 510 may be used together with the discriminative sticker 700.

As shown in FIG. 2, the discriminative sticker 700 is attached on the outer circumferential face of the rod housing 210 facing toward the photosensor module 510. In this connection, in the contact withdrawn state, a position (hereinafter, a sensed position) of the discriminative sticker 700 related to the light emission and reception from the photosensor module 510 corresponds to the open position of the discriminative sticker 700. In the contact withdrawn state, the position related to the light emission and light reception thereof is always the same. Further, in the contact inserted state, an initial position of the discriminative sticker 700 related to the light emission and reception of the photosensor module 510 corresponds to the closed position of the discriminative sticker 700. The position sensed by the photosensor module 510 is the same until the contact wear occurs.

As the contact wear amount increases, and thus the rod housing 210 rises up, the position sensed by the photosensor module 510 gradually changes. The discriminative sticker 700 has the gradient. Thus, when the light emission and light receiving position changes, a current value of the reflected light therefrom also changes.

As the movable contact is repeatedly inserted and thus the contact wear amount increases, as shown in FIG. 5, a vertical level of the rod housing 210 gradually move upwardly. As the rod housing 210 ascends, the discriminative sticker 700 also ascends. Because the positions of the light-emitter 512 and the light-receiver 514 of the photosensor module 510 are fixed, a vertical level of a position in the discriminative sticker 700 toward and from which the light emits and is received gradually descend (to a level lower than the closed position in FIG. 5) as the discriminative sticker 700 ascends.

Referring to the discriminative sticker 700 in FIG. 4, the sensed position faces toward the white area of the discriminative sticker 700, so that the current value of the reflected light gradually increases as the contact wear amount increases. Because black is a color that absorbs light, the amount of reflected light increases and thus an amount of current increases as the sensed position moves toward white. Therefore, a voltage value converted from the current value also gradually increases. Thus, the vertical displacement of the rod housing 210 may be identified using the data processing device 800 based on the voltage value.

When the voltage value or current value measured by the photosensor module 510 reaches a threshold value, the data processing device 800 may determine that the contact wear amount has reached a threshold value and inform the user of the determination result. Further, the data processing device 800 may correct the contact wear amount based on the temperature change (this correction will be described later).

The photosensor module 510 may not detect the vertical displacement directly. However, the change in reflectivity according to the change in the contrast of the discriminative sticker 700 creates the effect of converting the vertical displacement into the horizontal displacement. Therefore, the photosensor module 510 may be applied to indirectly monitor and detect the contact wear amount.

The contact wear amount monitored by the photosensor module 510 may be monitored in real time or at a preset time period. An output value of the photosensor module 510 is transmitted to the data processing device 800 for processing and analysis. Accordingly, because the device 800 determines the contact wear amount before the contact wear amount is greater than a limit value, an appropriate maintenance time may be identified. Further, this may improve reliability and performance of the vacuum circuit breaker.

Figure 6:
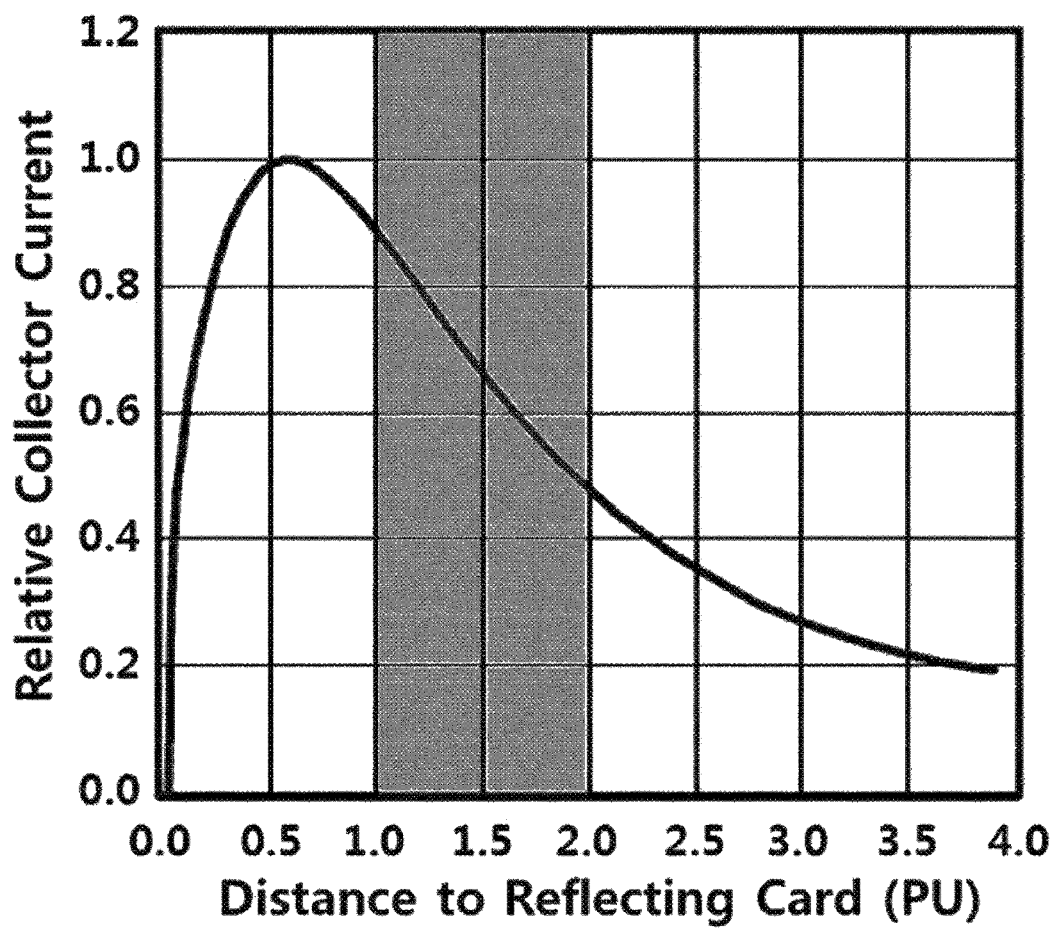
FIG. 6 is a graph showing an example of an output characteristic based on a distance of the contact monitoring device according to the first embodiment or the second embodiment of the present disclosure.

FIG. 6 is a graph showing an example of an output characteristic based on a distance of the contact monitoring device according to the first embodiment or the second embodiment of the present disclosure.

As shown in FIG. 6, there is a section in which an output value (relative collector current) based on the distance from a reflective surface from which the light emitting from the photosensor module 510 is reflected linearly appears. For example, the photosensor module 510 may exhibit an output value linearly when the reflective surface is present within a distance of 1.0 to 2.0 (PU).

However, in accordance with the present disclosure, the photosensor module 510 is used to measure the displacement in the vertical direction as described above, rather than to measure the displacement in the horizontal direction. Therefore, the section in which the output value of the photosensor module 510 exhibits linearity may be applied to the discriminative sticker 700 to set the light emission and light receiving position of the photosensor module 510 and the closed position. That is, the position of the discriminative sticker 700 may be set so that the position sensed by the photosensor module 510 and the closed position do not deviate from the section in which the output value of the photosensor module 510 exhibits the linearity.

The photosensor module used for sensing the contact wear amount in the contact monitoring device of the present disclosure having the above configuration may have operating characteristics varying depending on ambient temperatures.

Figure 7:
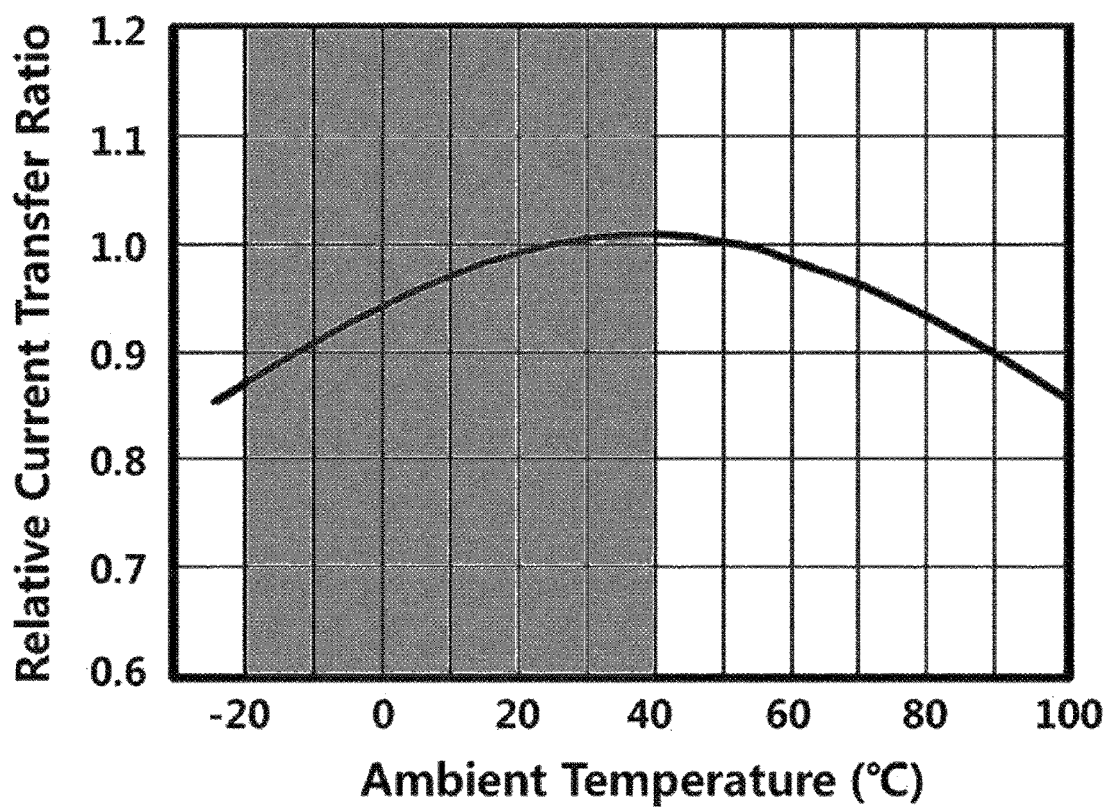
FIG. 7 is a graph showing an example of a temperature characteristic of the contact monitoring device according to the first embodiment or the second embodiment of the present disclosure.

FIG. 7 is a graph showing an example of a temperature characteristic of the contact monitoring device according to the first embodiment or the second embodiment of the present disclosure.

The photosensor module 510 generally has a temperature characteristic as shown in FIG. 7 though there are differences depending on types thereof. Because the photosensor module 510 may emit and receive light to measure the displacement, a magnitude of the photocurrent varies according to the amount of light as received. A relative current conversion based on the temperature of the photosensor module 510 gradually increases as the temperature changes from −20° C. to 40° C., and then decreases from 40° C.

At an actual site, a temperature condition according to an operation environment of the vacuum circuit breaker A is in a range wider than a range of −5 degrees C. to +40 degrees C. However, as shown in FIG. 7, a difference between the outputs of the photosensor module 510 at temperatures of minus 20 degrees Celsius and plus 40 degrees Celsius may be larger than or equal to 10%. Because the photosensor module 510 also operates within the temperature range of the site's operation environment, an error of up to 10% or greater may occur depending on the temperature change.

Therefore, when the output characteristic of the photosensor module 510 is not considered based on the temperature characteristic, the output value of the photosensor module 510 may vary according to the ambient temperature even when the monitored position is the same. When the contact wear amount is monitored based on the output value of the photosensor module 510 without proper correction based on the temperature, an inaccurate result occurs.

To solve this problem, the output value of the photosensor module 510 may be periodically measured and the output value may be corrected in consideration of the characteristic based on the temperature, thereby obtaining an accurate contact wear amount.

Hereinafter, a correction method of a contact monitoring device for a vacuum circuit breaker that may compensate for the output value deviation of the photosensor module according to the operation temperature will be described in detail (in a following description, a subject of controlling each step is the data processing device through the subject is not separately mentioned). Further, a case in which the data processing device performs control based on a voltage value to which a current value of the reflected light detected by the photosensor module is converted will be described. However, this is only an example. The current value may be used as a control reference.

Figure 8:
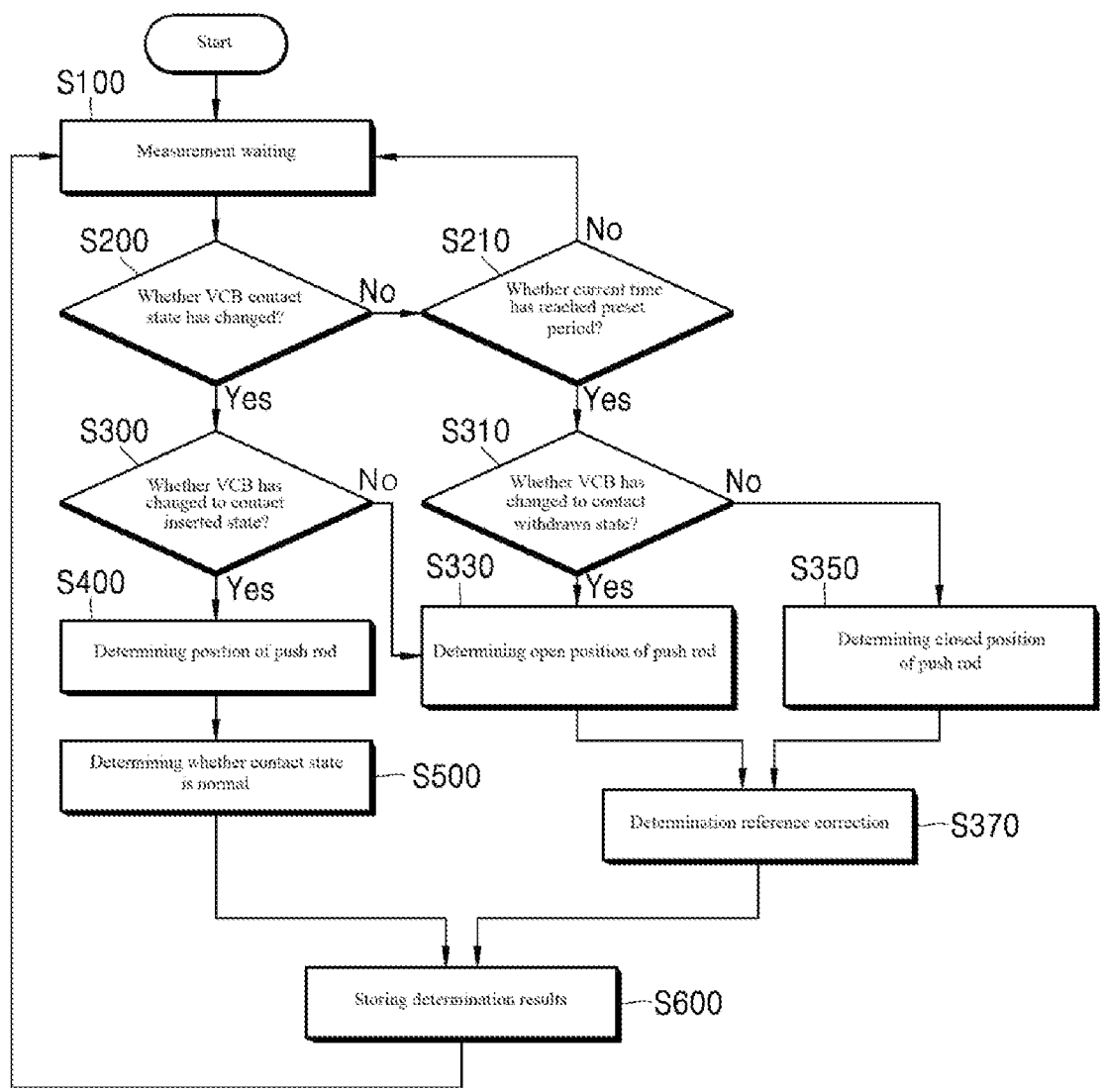
FIG. 8 is a flowchart showing a correction method of the contact monitoring device according to the first embodiment of the present disclosure.
Figure 9:
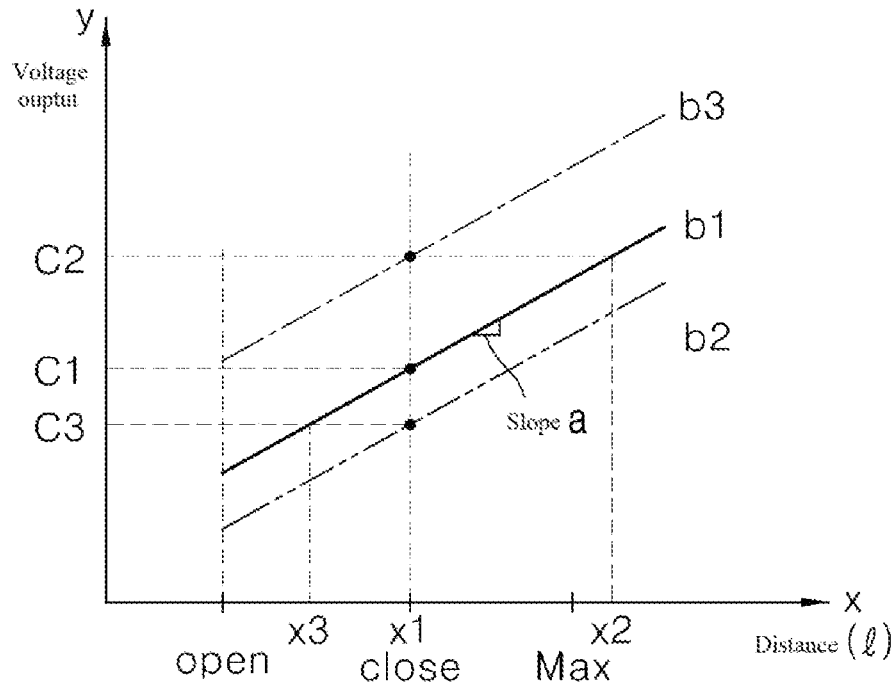
FIG. 9 is a graph showing a distance-based output voltage based on a temperature of the contact monitoring device according to the first embodiment or the second embodiment of the present disclosure.

FIG. 8 is a flowchart showing the correction method of the contact monitoring device according to the first embodiment of the present disclosure. FIG. 9 is a graph showing a distance-based output voltage based on a temperature of the contact monitoring device according to the first embodiment or the second embodiment of the present disclosure.

As shown in FIG. 8, the data processing device 800 determines whether a contact state of the vacuum circuit breaker A has changed in a measurement waiting state S100 of the photosensor module 510 in S200. The meaning that the contact state of the vacuum circuit breaker A has changed means that there is a change from the contact withdrawn (open) state which is the contact withdrawn state to the contact inserted state, or the change from the contact inserted (closed) state to the contact withdrawn (open) state. When the contact state has changed, the voltage value output from the photosensor module 510 changes. However, when the contact state has not changed, a position detected by the photosensor module 510 has not changed. Thus, the voltage value as measured periodically is constant. Therefore, the data processing device 800 first determines whether the contact state of the vacuum circuit breaker A has changed.

When the contact state of the vacuum circuit breaker A has changed in the step S200, the data processing device 800 determines whether the movable contact 136a of the vacuum circuit breaker A has changed to the contact inserted state in which the movable contact is in contact with the fixed contact 134a in S300. Because the contact wear does not occur in the contact withdrawn state, but the contact wear occurs only in the contact inserted state, it is determined whether the change to the contact inserted state occurs in the step S300.

When the movable contact has been inserted in the step S300, a position of the push rod assembly 200 is determined based on the voltage output value output from the photosensor module 510 in S400. That is, as described above, the amount of current that varies depending on the amount of light reflected from the discriminative sticker 700 attached to the rod housing 210 is converted to the voltage value using the circuit 516 of the photosensor module 510. The voltage value is analyzed by the data processing device 800. Thus, the position of the push rod 230 is determined based on a position resulting from the analysis result (the position of the push rod may be identified based on a position of the rod housing 210 of the push rod assembly).

When the rod housing 210 moves from the open position to the initial inserted position, the position where the light emitting from the light-emitter 512 is reflected moves from the open position of the discriminative sticker 700 to the closed position thereof. Because discriminative sticker 700 has the gradation, the amounts of light in the open and closed positions are different from each other, and the voltage values according to the light current values in the open and closed positions are different from each other. Therefore, the displacement of the rod housing 210 may be identified based on the output voltage value output from the photosensor module 510, and then, the displacement of the push rod 230 that actually moves the movable contact 136a may be calculated based on the displacement of the rod housing 210.

When the position of the push rod 230 is determined in the step S400, the data processing device 800 determines whether the contact state is normal during the insertion of the movable contact and whether the contact wear amount is smaller than or equal to a set value in S500. The determination of the contact state and whether the contact wear amount is smaller than or equal to the set value using the data processing device 800 is based on a pre-stored contact wear amount determination reference. The contact wear amount determination reference may be stored in the data processing device 800 in a form of a graph of FIG. 9 or in a form of data from which the graph of FIG. 9 may be derived.

Thereafter, the above-described signal processing result and calculation result is stored in S600, and then the same process is repeated.

When the contact state of the vacuum circuit breaker A has not changed in the step S200 described above, it is determined whether a current time has reached a preset period in S210. When the current time has reached the preset period, the data processing device 800 determines whether the vacuum circuit breaker A is in an open state when the current time has reached the preset period in S310.

When the vacuum circuit breaker A is in the contact withdrawn (open) state in the step S310, the method may measure an open position of the push rod 230 based on the voltage output value output from the photosensor module 510 in S330. When the vacuum circuit breaker A is not in the contact withdrawn (open) state in the step S310, the method may measure a closed position of the push rod 230 based on the voltage output value output from the photosensor module 510 in S350.

A graph of a voltage output value having a certain slope (a) may be derived as shown in FIG. 9 based on measuring results of the open position and the closed position at the time of the initial insertion. The voltage output value of the photosensor module 510 based on a moving distance of the rod housing 210 is shown as a graph in a form of a straight line. An x-axis of the graph denotes a moving distance of the discriminative sticker 700 when changing from the contact withdrawn (open) state to the contact inserted (closed) state. An y-axis denotes the voltage output value output from the photosensor module 510 at the time of measurement.

It is determined whether correction on the reference for contact wear amount determination based on the temperature is required based on the open and closed positions of the push rod 230 measured in the S330 or S350 step. Thus, when the temperature has been changed, the method corrects the contact wear amount determination reference in S370. When the contact wear amount determination reference has been corrected, the method proceeds to the step S600.

Whether the correction on the contact wear amount determination reference is required may be determined as follows.

Under a test condition after the manufacture of the vacuum circuit breaker A, the voltage output value of the photosensor module 510 is measured in an open position as a first open state. The voltage output value of the photosensor module 510 is measured in a closed position as a first inserted state. Thus, a graph of the voltage output value of the photosensor module 510 at a test temperature may be obtained. For example, when the test condition is 20 degrees Celsius, the x-axis and y-axis values are identified, and thus a graph b1 in FIG. 9 may be derived based on a linear equation of ax+b=y. Similarly, when the test condition is 15 degrees Celsius, a graph b2 may be derived. When the test condition is 30 degrees Celsius, a graph b3 may be derived.

In this way, tests are performed under various temperature conditions and then, voltage output value data of the photosensor module 510 based on each operation temperature of the vacuum circuit breaker A may be pre-stored in the data processing device 800. Alternatively, the data processing device 800 may store therein voltage output value data of the photosensor module 510 derived under one temperature condition. When necessary, the data processing device 800 may derive a new graph based on the data and use the new graph as a reference for determining the contact wear amount.

In more detail, because a voltage output value graph represents the contact state, the voltage output value does not change when the state of the contact does not change. Therefore, a graph having the same slope such as b1 or b2 based on the change of temperature condition may be used as a reference for determining the state of the photosensor module 510.

That is, when the voltage output value output from the photosensor module 510 has changed even though the state of the contact has not changed, it is determined that the external temperature has changed. Thus, the voltage output value graph as a reference is changed.

After installing the vacuum circuit breaker A on the site, the voltage output value of the photosensor module 510 in the open position is measured. In the contact withdrawn (open) state, the push rod 230 does not move and thus, the rod housing 210 and the discriminative sticker 700 also do not move. Thereafter, when the movable contact is inserted while the temperature of the site has not changed, the voltage output value of the photosensor module 510 is measured at the closed position as the contact inserted state. Thus, a graph corresponding to the temperature of the site may be derived based on the measured value.

For example, it may be assumed that a reference graph derived based on the voltage output value of the photosensor module 510 at the site is b1. When the contact of the vacuum circuit breaker A does not change to the closed state or inserted state according to the steps S210, S310, and S350 as described above and a measurement result of the voltage output value of the photosensor module 510 is a C1 value, a contact wear amount x1 corresponding to the voltage output value C1 is the same as the contact wear amount in the closed position. Thus, the data processing device 800 may determine that the temperature of the site has not changed. In this case, the method may keep the b1 graph as a reference for determination of the contact wear amount.

The voltage output value of the photosensor module 510 is measured at the preset period. In this connection, the voltage output value is measured as C2 even though the contact state has not changed. Thus, the data processing device 800 may determine that the site temperature has increased. This is because when there is no temperature change, C2 should correspond to the same position as that corresponding to C1; however, the temperature increases because the voltage output value is indicated as C2. In this connection, when the contact wear amount is determined based on the voltage output value measured as C2 and using the graph b1 as the reference, the contact wear amount becomes x2. Thus, it is incorrectly determined that the contact wear amount exceeds a threshold value Max even though it does not actually exceed the threshold value Max. Therefore, the data processing device 800 does not use the graph b1 as the reference for determining the contact wear amount, but shifts the graph again by a y-intercept value which has shifted from C1 to C2, and thus uses the graph b3 as a reference for determining the contact wear amount.

Conversely, when the voltage output value of the photosensor module 510 is measured as C3 even though the contact state has not changed, the data processing device 800 may determine that the temperature of the site has decreased. This is because when there is no temperature change, C3 should correspond to the same position as a position corresponding to C1; however the voltage output value is indicated as C3 due to the temperature decrease. In this connection, when the contact wear amount is determined based on the voltage output value measured as C3 and using the graph b1 as the reference, the contact wear amount becomes x3. Thus, the contact wear amount is incorrectly determined. Therefore, the data processing device 800 does not use the b1 graph as a reference for determining the contact wear amount but moves the graph again by an y-intercept which has shifted from C1 to C3. Thus, the graph b2 is used as a reference for determining the contact wear amount.

However, even when there is no temperature change, and when the contact insert occurs several times and the contact wear amount increases, the voltage output value changes. In this case, because the temperature has not changed, the contact wear amount determination reference is not corrected.

The contact wear occurs only when the movable contact is inserted. The contact withdrawn (open) state is always maintained before the contact is inserted. In the contact withdrawn (open) state, the position of the push rod 230 is always the same, so that the voltage value does not change and always is the same. Therefore, in the contact withdrawn (open) state, the voltage value of the photosensor assembly 510 is measured to set the reference graph. When the contact wear occurs due to the contact insertion, a reference graph in a current contact withdrawn (open) state is compared with the reference graph in the previous contact withdrawn (open) state to determine the contact wear amount based on the voltage output value.

As described above, when the contact wear amount determination reference based on the temperature is not corrected, the device may not accurately determine that the contact wear amount exceeds a preset maximum value even though the contact wear amount actually exceeds the preset maximum value. Conversely, it may be incorrectly determined that the contact wear amount has reached the maximum value even though it has not actually reached the preset maximum value.

Therefore, in order to prevent this problem, the device may periodically check the voltage output value of the photosensor module 510. When it is determined that the temperature change has occurred, the reference graph may be corrected to obtain the correct reference for determination of the contact wear amount.

A difference between a distance value corresponding to the voltage output value of the photosensor module 510 measured when the contact is inserted once and a distance value corresponding to the voltage output value of the photosensor module 510 measured when the contact is inserted twice corresponds to the contact wear amount. When the contact wear amount reaches a maximum value, the data processing device 800 may be configured to output a warning message to the user. Alternatively, the data processing device 800 may be configured to output a warning message to the user before the contact wear amount reaches the maximum value.

For example, when the maximum value of the contact wear amount is set to 5 mm, the data processing device 800 may be configured to output a warning message to the user when the contact wear amount reaches 5 mm or 4.8 mm.

Figure 10:
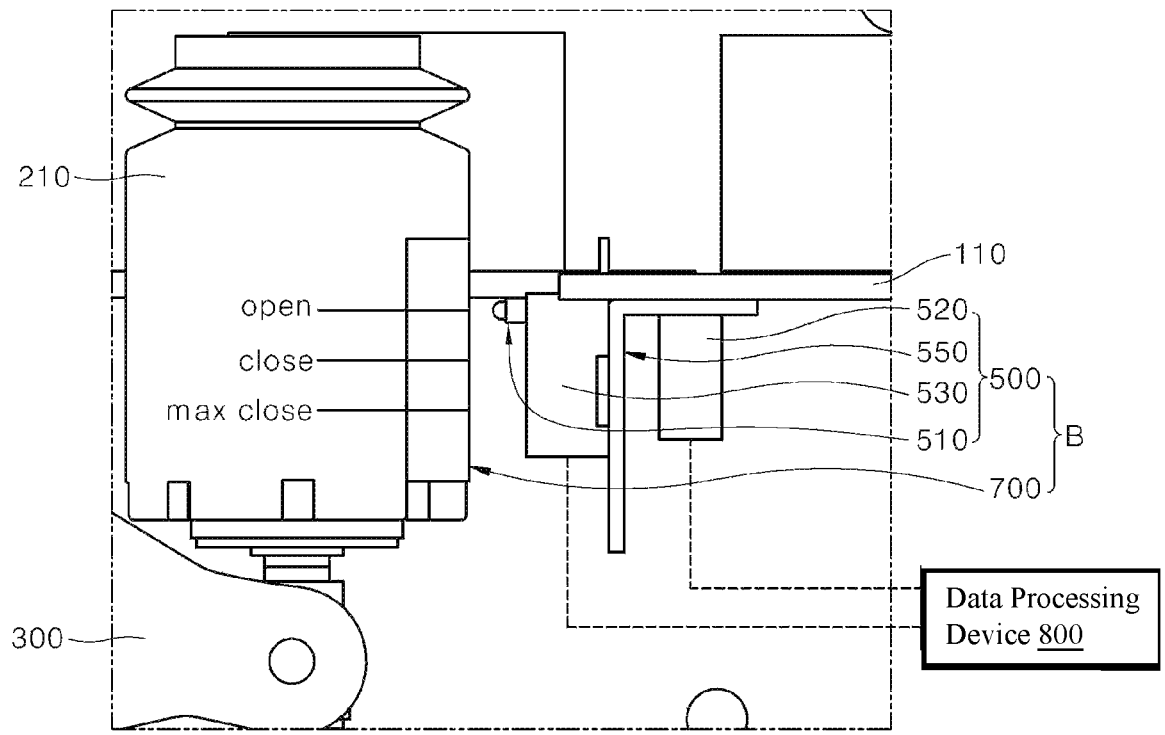
FIG. 10 is a perspective view showing an installed state of the contact monitoring device according to the second embodiment of the present disclosure.
Figure 11:
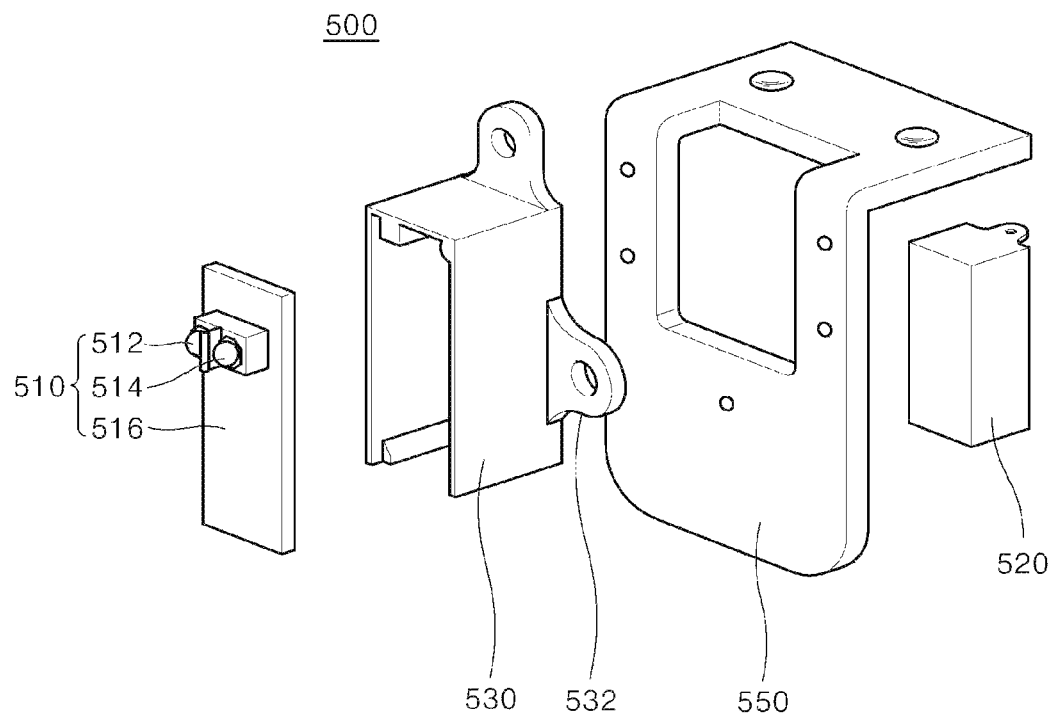
FIG. 11 is an exploded perspective view showing a photosensor of the contact monitoring device according to the second embodiment of the present disclosure.
Figure 12:
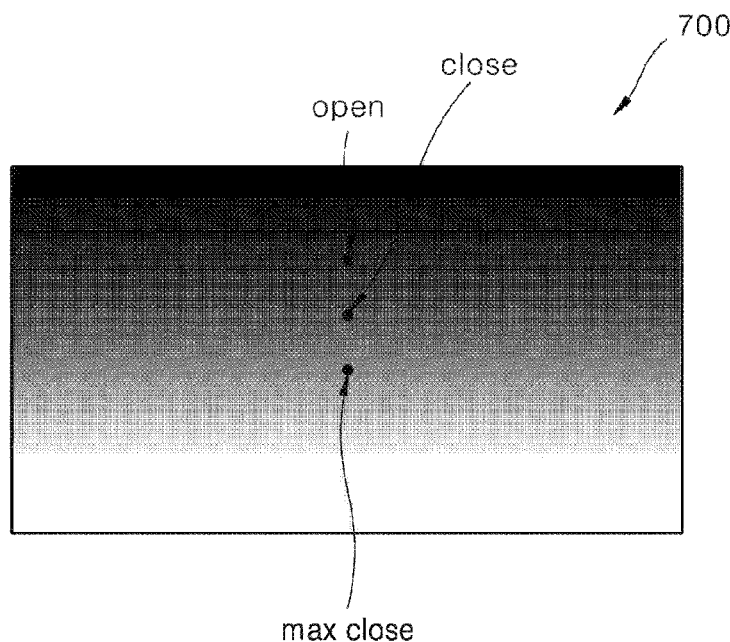
FIG. 12 is a schematic diagram showing a discriminative sticker of the contact monitoring device according to the second embodiment of the present disclosure.
Figure 13:
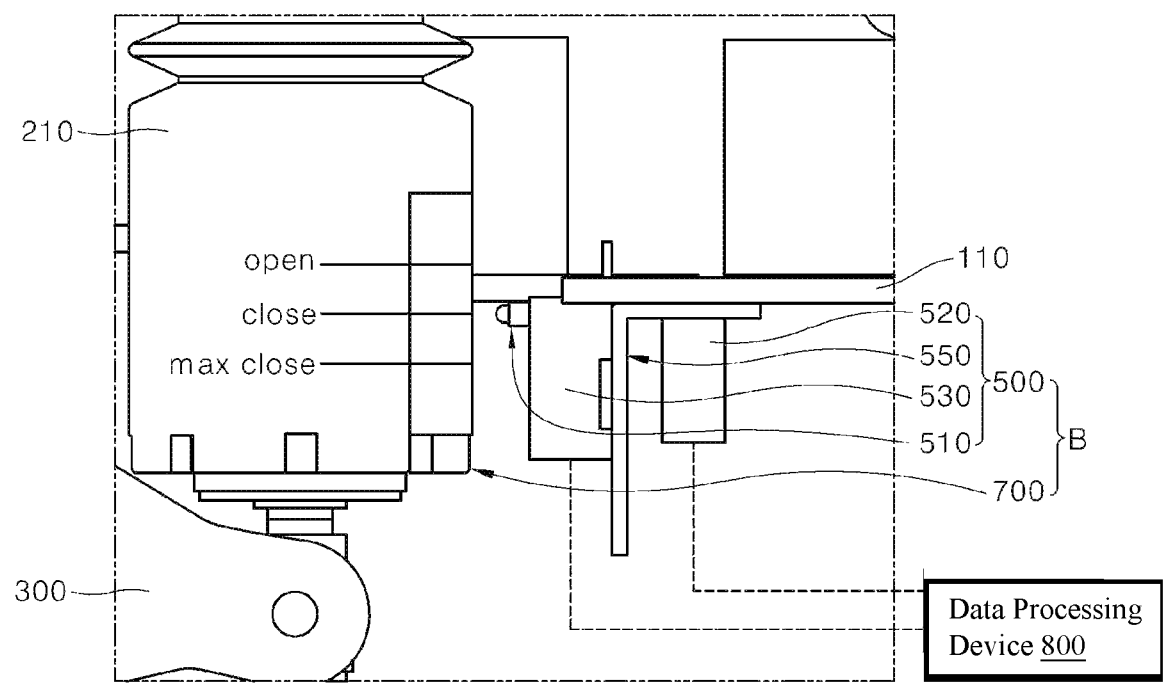
FIG. 13 is a perspective view showing an operating state of the contact monitoring device according to the second embodiment of the present disclosure.

FIG. 10 is a perspective view showing an installed state of the contact monitoring device according to the second embodiment of the present disclosure. FIG. 11 is an exploded perspective view showing a photosensor of the contact monitoring device according to the second embodiment of the present disclosure. FIG. 12 is a schematic diagram showing a discriminative sticker of the contact monitoring device according to the second embodiment of the present disclosure. FIG. 13 is a perspective view showing an operating state of the contact monitoring device according to the second embodiment of the present disclosure.

As shown in FIG. 10 and FIG. 11, a contact monitoring device B according to the second embodiment of the present disclosure includes the sensor assembly 500 installed on a bottom of the main circuit 100, the discriminative sticker 700 attached to an outer circumferential face of the rod housing 210, and the data processing device 800 for overall control and determination. Hereinafter, the contact monitoring device according to the second embodiment of the present disclosure will be described with a focus on the difference thereof from the contact monitoring device according to the first embodiment of the present disclosure.

In the contact monitoring device B according to the second embodiment of the present disclosure, the sensor assembly 500 further includes a temperature sensor 520 that measures a temperature around the photosensor module 510.

The temperature sensor 520 is installed adjacent to the photosensor module 510. The temperature sensor 520 is used to correct the characteristic based on the temperature of the photosensor module 510. Therefore, it is preferable that the temperature sensor 520 be installed as close to the photosensor module 510 as possible. The temperature sensor 520 may be installed in a state of being mounted on a separate holder (not shown) to be coupled to a sensor bracket 550 to be described later.

The temperature sensor 520 is supported by the sensor bracket 550. The temperature sensor 520 may be coupled to a rear face of a plate surface of the sensor bracket 550 to which the sensor holder 530 is coupled or may be coupled to a bottom face of a portion to which the sensor bracket 550 is coupled to the housing 110. The temperature sensor 520 may be directly connected to the sensor bracket 550 via a fastening member such as a bolt (not shown), or may be coupled to a separate holder and thus mounted on the sensor bracket 550.

As shown in FIG. 12, the discriminative sticker 700 is positioned such that an open position of FIG. 10 in the contact withdrawn state is set as a position (sensed position) that reflects the light emitting from the photosensor module 510.

Thereafter, whenever the movable contact is inserted, the contact is worn. Thus, the push rod assembly 200 rises up gradually, so that the discriminative sticker 700 gradually rises up. Accordingly, the position detected by the photosensor module 510 moves toward the bottom of the discriminative sticker 700. When the displacement of the push rod assembly 200 according to the increase of the number of contact insertions is within a preset contact wear amount, the position detected by the porter sensor module 510 is located between the open position and the maximum closed position in FIG. 13.

When the push rod assembly 200 rises up above the preset contact wear amount, a position detected by the photosensor module 510 corresponding to a maximum value of the preset contact wear amount is defined as the maximum closed position Max closed (refer to FIG. 10 and FIG. 13). Which position in the discriminative sticker 700 corresponds to each of the position sensed by the photosensor module 510 and the position at which the contact wear amount is maximized may be pre-determined before the contact monitoring device is installed on the site.

In one example, an output signal according to a sensing result within the maximum closed position range at the open position of the discriminative sticker 700 as measured by the photosensor module 510, and a sensing result of the temperature sensor 520 are transmitted to the data processing device 800. As shown in FIG. 10 and FIG. 13, the data processing device 800 is installed outside the vacuum circuit breaker A and communicates with the photosensor module 510 and the temperature sensor 520. The data processing device 800 analyzes the output signal of the photosensor module 510 to determine the position of the push rod assembly 200. Further, the data processing device 800 determines the contact wear amount based on the position of the push rod assembly 200 and determines whether to warn the user. The data processing device 800 sets the contact wear amount determination reference required for contact wear amount determination and corrects the reference based on the temperature. In this connection, the correction of the characteristic value of the photosensor module 510 based on the temperature by the data processing device 800 is made based on the measured value of the temperature sensor 520.

Figure 14:
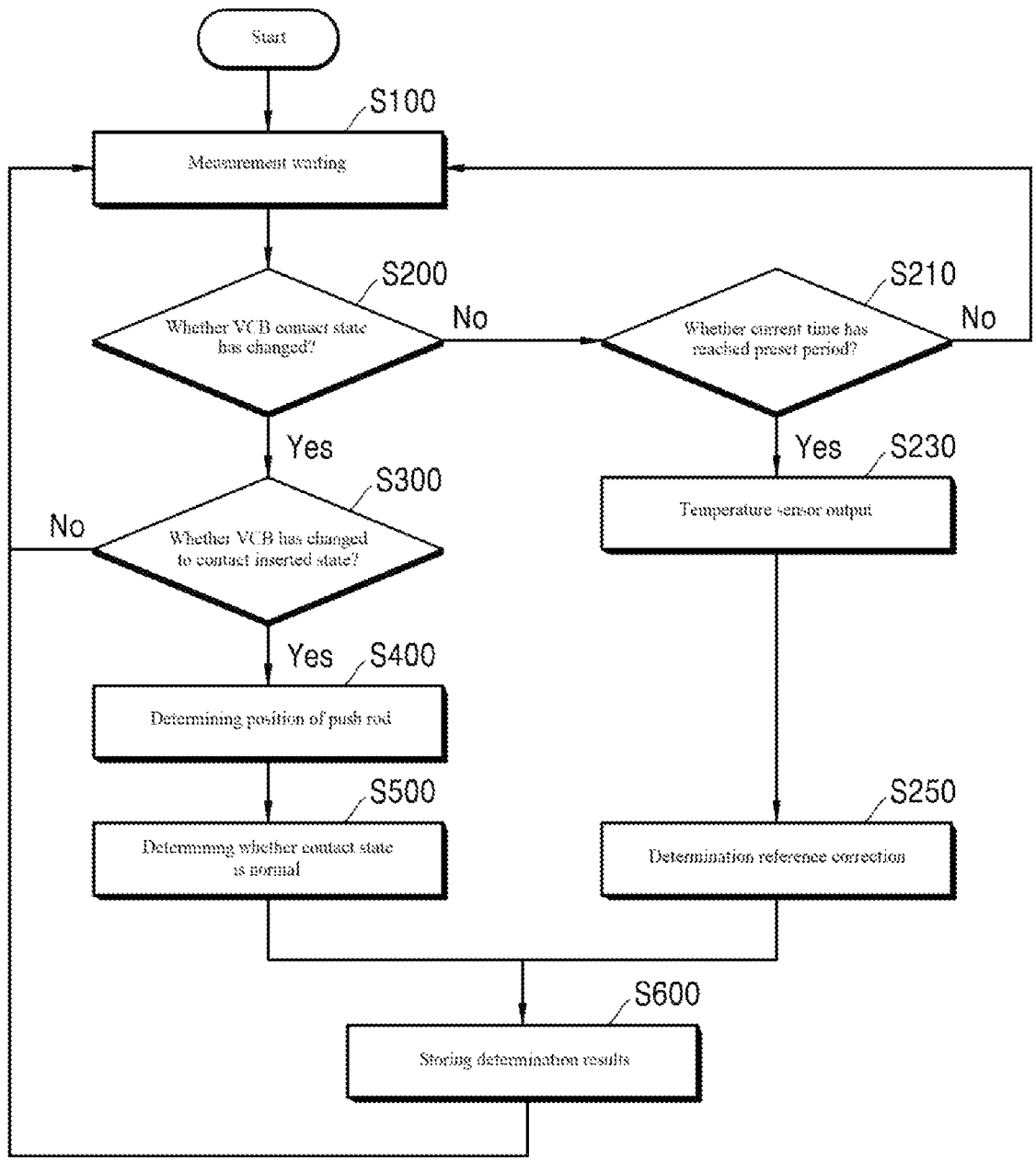
FIG. 14 is a flowchart illustrating a correction method of the contact monitoring device according to the second embodiment of the present disclosure.

FIG. 14 is a flowchart illustrating a correction method of the contact monitoring device according to the second embodiment of the present disclosure.

As shown in FIG. 14, the data processing device 800 determines whether the contact state of the vacuum circuit breaker A has changed in the measurement waiting state S100 of the photosensor module 510 in S200.

When the contact state of the vacuum circuit breaker A has changed in the step S200, the data processing device 800 determines whether the movable contact 136a of the vacuum circuit breaker A has changed to the contact inserted state in which the movable contact is in contact with the fixed contact 134a in S300.

When the contact is inserted in the step S300, the position of the push rod assembly 200 is determined based on the voltage output value output from the photosensor module 510 in S400.

When the position of the push rod 230 is determined in the step S400, the data processing device 800 determines whether the contact state is normal in the insertion of the contact and whether the contact wear amount is smaller than or equal to the set value in S500.

Thereafter, the above-described signal processing result and calculation result are stored in S600, and then the same process is repeated.

When the contact state of the vacuum circuit breaker A has not changed in the step S200 described above, the data processing device 800 determines whether a current time has reached the preset period in S210. After determining whether the current time has reached the preset period in S210, when the current time has reached the preset period, the data processing device 800 checks the output signal of the temperature sensor 520 to check the temperature around the photosensor module 510.

The temperature is measured in real time, and the measured value of the temperature sensor 520 is transmitted to the data processing device 800 in real time or periodically in S230. The data processing device 800 receives the measured value of the temperature sensor 520 in real time or periodically as needed, or processes the measured value as transmitted in real time or periodically as needed. Therefore, the data processing device 800 corrects the contact wear amount determination reference when the temperature has changed in S250. When the contact wear amount determination reference has been corrected, the method proceeds to the step S600.

Using the graph b1 in FIG. 9 as a reference value, the method measures an open position in the contact withdrawn (open) state after installing the vacuum circuit breaker A on the site. In the contact withdrawn (open) state, the push rod 230 does not move, and thus the rod housing 210 and the discriminative sticker 700 also do not move. Therefore, the open position is constant under the test condition. Thereafter, the method measures a voltage output value of the photosensor module 510 at the closed position as the contact inserted (closed) state. A graph corresponding to the temperature of the site may be derived based on the measured value.

However, because the characteristic of the photosensor module 510 varies based on the temperature, the voltage output value of the photosensor module 510 changes when a temperature at the site is different from a test temperature. That is, when measuring the temperature around the photosensor module 510 in real time or periodically and when the temperature change is detected, the data processing device 800 may determine that the temperature of the photosensor module 510 has changed.

For example, when the temperature of the temperature sensor 520 is higher than a previous measured value while the reference of the contact wear amount determination is set as the b1 graph, the data processing device 800 may determine that the temperature around the vacuum circuit breaker A is higher than the test condition. In this case, the temperature has increased, and thus, the graph that serves as a reference for the determination of contact wear amount is changed from b1 to b3.

Alternatively, when the measurement result of the temperature sensor 520 is lower than the previous measurement temperature, the data processing device 800 may determine that the temperature around the vacuum circuit breaker A is lower than the test condition. In this case, the temperature has dropped, and thus, the graph as the reference for determining the contact wear amount is changed from b1 to b2.

The reference value has to be changed from b1 to b2 or b3 due to the temperature change. However, then the contact wear amount is determined without changing the reference from b1 to b2 or b3, the device may not accurately determine the contact wear amount. In this case, even when the contact wear amount actually exceeds the preset maximum, the device may not accurately determine this situation.

For example, it may be assumed that when referring to the graph b1, the voltage output value of the photosensor module 510 is C1; when the temperature increases, the voltage output value is C2. In this connection, when the reference graph is not changed to b3 though the temperature has increased, the contact wear amount corresponding to C2 with referring to the graph b1 becomes x2. Thus, it seems like that the amount exceeds a present threshold value of the contact wear amount. Therefore, the contact wear amount is erroneously determined as exceeding the threshold value even though it has not reached the threshold value.

Further, it may be assumed that when the voltage output value is C3 when the temperature is lowered. The reference graph should be changed to b2 due to the lowered temperature. Unless the device changes the reference graph to b2, the contact wear amount corresponding to C3 with reference to graph b1 becomes x3. Thus, the contact wear amount is incorrectly determined.

Therefore, to order to prevent this problem, when the state of the contact has not changed, the temperature may be measured in the contact withdrawn (open) state or inserted (closed) state in real time or periodically. When the temperature change occurs, the contact wear amount determination reference may be changed based on the temperature.

When the contact wear amount determination reference has changed, a contact wear amount determination reference in the contact inserted (closed) state may employs the changed reference.

The present disclosure as described above may be subjected to various substitutions, modifications and changes within the scope that does not depart from the technical spirit of the present disclosure by those of ordinary skill in the technical field to which the present disclosure belongs. Thus, the present disclosure is not limited to the above-described embodiments and the attached drawings.

What is claimed is:

1. A contact monitoring device for a vacuum circuit breaker, wherein the vacuum circuit breaker includes a push rod assembly coupled to a movable electrode of a vacuum interrupter to raise or lower the movable electrode,
    wherein the contact monitoring device comprises:
        a discriminative sticker attached to an outer circumferential surface of the push rod assembly, extending along a moving direction of the push rod assembly, and composed of a plurality of areas whose reflectance vary step by step;
        a photosensor module including:
            a light-emitter facing toward the discriminative sticker and emitting light toward the discriminative sticker;
            a light-receiver facing toward the discriminative sticker and receiving light reflected from the discriminative sticker; and
            a circuit coupled to the light-emitter and the light-receiver, wherein the circuit processes a signal from the light-receiver and obtains an amount of current according to intensity of the reflected light, based on the processing result; and
        a data processing device communicating with the photosensor module, wherein the data processing device is configured to
        determine a movement amount of the push rod assembly from a withdrawn state to an inserted state of the movable electrode based on the amount of the current obtained by the photosensor module and to calculate a contact wear amount based on the movement amount; and
        in response to a state of the movable electrode remaining in the inserted state or the withdrawn state for a predefined period of time, applying a correction to the contact wear amount determined based on the movement amount, the correction based on:
            an open position of the push rod assembly of the vacuum circuit breaker based on the voltage output value output from the photosensor module, when the vacuum circuit breaker has remained in the withdrawn state for the predefined period of time; or
            a closed position of the push rod assembly of the vacuum circuit breaker based on the voltage output value output from the photosensor module, when the vacuum circuit breaker has remained in the inserted state for the predefined period of time.

2. The contact monitoring device of claim 1, wherein the plurality of areas of the discriminative sticker are arranged in a gradation manner.

3. The contact monitoring device of claim 1, wherein the device further comprises a temperature sensor installed adjacent to the photosensor module to measure a temperature around the photosensor module,
    wherein the data processing device is configured to:
    communicate with the temperature sensor;
    determine the movement amount of the push rod assembly based on the amount of the current obtained by the photosensor module;
    calculate the contact wear amount based on the movement amount; and
    correct a contact wear amount determination reference based on a measurement result of the temperature sensor.

4. A correction method of a contact monitoring device for a vacuum circuit breaker, wherein the device monitors a contact state using a voltage output value output from a photosensor, module to determine when to repair or replace the vacuum circuit breaker, wherein the method comprises:
    a step S200 of determining whether the contact state of the vacuum circuit breaker has changed;
    when the contact state of the vacuum circuit breaker has changed in the S200 step, a step S300 of determining whether the vacuum circuit breaker has changed to a contact inserted state;
    when the vacuum circuit breaker has changed to the contact inserted state in the S300 step, a step S400 of determining a position of a push rod assembly of the vacuum circuit breaker based on a voltage output value output from the photosensor module;
    when the position of the push rod assembly is determined in the S400 step, a step S500 of determining, based on a contact wear amount determination reference, whether the contact state is normal in the contact insertion, and whether a contact wear amount is smaller than or equal to a set value; and a step S600 of storing the determination result of the S500 step;

when the contact state of the vacuum circuit breaker is not changed in the S200 step, a step S210 of determining whether a current time has reached the preset period;

when the current time has reached the preset period in the S210 step, a step S310 of determining whether the vacuum circuit breaker is in a contact open state;

when the vacuum circuit breaker is in the contact open state in the S310 step, a step 330 of measuring an open position of the push rod assembly of the vacuum circuit breaker based on the voltage output value output from the photosensor module;

when the vacuum circuit breaker is not in the contact open state in the S310 step, a step S350 of measuring a closed position of the push rod assembly of the vacuum circuit breaker based on the voltage output value output from the photosensor module;

a step S370 of determining whether the contact wear amount determination reference correction of the photosensor module is required based on the open or closed position of the push rod assembly measured in the S330 or the S350 step, and correcting the contact wear amount determination reference; and replacing or repairing the vacuum circuit breaker.

5. The method of claim 4, wherein the position of the push rod assembly, the open position and the closed position of the push rod assembly respectively in the S330, the S350 and the S400 step is measured by emitting light the photosensor module to a discriminative sticker attached to an outer circumferential surface of a rod housing of the push rod assembly, and measuring a current value of light reflected from the discriminative sticker and received by the photosensor module or a voltage output value converted from the current value.

6. The method of claim 5, wherein the discriminative sticker disposed along a moving direction of the push rod assembly, and is composed of a plurality of areas whose reflectance vary step by step.

7. The method of claim 6, wherein the plurality of areas of the discriminative sticker are arranged in a gradation manner.

8. The method of claim 5, wherein the photosensor module includes:

a light-emitter facing toward the discriminative sticker and emitting light toward the discriminative sticker;

a light-receiver facing toward the discriminative sticker and receiving light reflected from the discriminative sticker; and a circuit coupled to the light-emitter and the light-receiver, wherein the circuit processes a signal from the light-receiver and obtains an amount of current according to intensity of the reflected light, based on the processing result.

9. The method of claim 4, wherein the S600 step is performed after the S370 step.

10. The method of claim 4, wherein the S370 step includes, when the voltage output value output from the photosensor module has changed while the contact state of the vacuum circuit breaker has not changed, determining that an external temperature has charged, and changing the contact wear amount determination reference.

11. The method of claim 4, wherein the method further comprises:

when the contact state of the vacuum circuit breaker has not changed in the S200 step, a step S210 of determining whether a current time has reached a preset period;

when the current time has reached the preset period in the S210 step, a step S230 of determining whether a temperature has changed based on a measured value of a temperature sensor; and upon determination that the temperature has changed in the S230 step, a step S250 of changing the contact wear amount determination reference.

12. The method of claim 11, wherein the S600 step is performed after the S250 step.

13. The method of claim 12, wherein upon determination that the temperature has increased or decreased in the S250 step, a current contact wear amount determination reference is changed to a contact wear amount determination reference corrected based on the increased or decreased temperature.

14. The method of claim 13, wherein the S230 step includes monitoring the measured value of the temperature sensor in real time or periodically.

* * * * *